United States Patent [19]
Konstantinov et al.

[11] Patent Number: 5,804,482
[45] Date of Patent: Sep. 8, 1998

[54] METHOD FOR PRODUCING A SEMICONDUCTOR DEVICE HAVING A SEMICONDUCTOR LAYER OF SIC

[75] Inventors: Andrei Konstantinov, Linköping; Erik Janzén, Borensberg, both of Sweden

[73] Assignee: ABB Research Ltd., Zurich, Switzerland

[21] Appl. No.: 436,486

[22] Filed: May 8, 1995

[30] Foreign Application Priority Data

Apr. 10, 1995 [SE] Sweden .................................. 9501311

[51] Int. Cl.⁶ .......................... H01L 21/336; H01L 21/76
[52] U.S. Cl. ........................... 438/268; 438/433; 438/931
[58] Field of Search .................. 257/77, 82; 437/22, 437/40, 41; 438/522, 268, 433, 931, 542

[56] References Cited

U.S. PATENT DOCUMENTS

| 3,510,369 | 5/1970 | Ernick et al. |
| 4,560,642 | 12/1985 | Yonezawa et al. |
| 5,286,660 | 2/1994 | Chiou et al. |
| 5,313,078 | 5/1994 | Fujii et al. ................................ 257/77 |
| 5,322,802 | 6/1994 | Baliga ...................................... 437/40 |
| 5,543,637 | 8/1996 | Baliga ...................................... 257/77 |
| 5,654,208 | 8/1997 | Harris et al. ............................. 438/931 |

FOREIGN PATENT DOCUMENTS 0 380 340  8/1990  European Pat. Off. .

OTHER PUBLICATIONS

Campbell et al., Electrical Properties of SiC Devices, in Mat. Res. Bull. vol. 4, pp. S 211–S 222, 1969, Pergamon Press Inc.

Vodakov et al., Diffusion and Solubility of Impurities in Silicon Carbide, 1973, Trans. III, Int. Conf., University of South Carolina Press.

*Primary Examiner*—John Niebling
*Assistant Examiner*—Michael S. Lebentritt
*Attorney, Agent, or Firm*—Pollock, Vande Sande & Priddy

[57] ABSTRACT

A method for producing a semiconductor device, having a semiconductor layer of a SiC comprises the steps of a) supplying dopants to the surface of the SiC layer during heating thereof for diffusion of the dopants into the SiC layer, and b) highly doping at least a portion of the surface layer of the SiC layer prior to step a) to control diffusion of the dopants into the SiC layer under the surface layer portion.

16 Claims, 2 Drawing Sheets

METHOD FOR PRODUCING A SEMICONDUCTOR DEVICE HAVING A SEMICONDUCTOR LAYER OF SIC

TECHNICAL FIELD OF THE INVENTION AND PRIOR ART

The present invention relates to a method for producing a semiconductor device having a semiconductor layer of SiC, the method comprising a step a) of supplying dopants to the surface of the SiC layer during heating thereof for diffusion of the dopants into the SiC layer.

All types of semiconductor devices, e.g. diodes, transistors and thyristors, benefit from the superior properties of SiC in comparison with especially, Si, namely the capability of SiC to function well under extreme conditions. SiC has a high thermal stability due to a large bandgap energy, so that devices fabricated from SiC material are able to operate at high temperatures, i.e. up to 1000° K. Furthermore, SiC has a high thermal conductivity, so that SiC devices may be arranged at a high density. SiC also has a more than five times higher breakdown field than Si so that it is well suited as a material in high power devices operating under conditions where high voltages may occur in the blocking state of a device.

Dopant diffusion into SiC, must, as a consequence of the characteristics be carried out at comparatively high temperatures, above 1500° C. However, the diffusion is, in general, extremely slow at these high temperatures, except for some impurities, such as boron and beryllium, which have been found to have reasonably high diffusivities. However, it is desirable to control the diffusion so as to produce a local dopant diffusion within a desired region of the SiC layer while preventing diffusion from occurring in another region thereof. It is also difficult, even if boron or beryllium are used as dopants, to obtain a diffusion deep enough into an SiC wafer for some purposes, for instance the formation of guard rings in an SiC power device. Due to the problems of masking some regions and obtaining a high diffusivity of a dopant in other regions, it has until now not been possible to consider using guard ring technique for passivation of SiC power devices. The guard ring technique is hardly ever used in high voltage devices made of silicon, since these typically have a depletion region of a few hundred microns which makes it difficult to create a compensated region of the necessary thickness. However, silicon carbide has a much higher breakdown field than silicon and a depletion region of only a few dozen microns is capable of holding kilovolts. The reduced thickness requirement makes the use of a guard ring technique reasonable in SiC power devices. The only way of obtaining area-defined diffusion in desired regions discussed previously required lapping and polishing to planarize the structure, which may lead to serious mechanical damages of its device deep into the bulk.

SUMMARY OF THE INVENTION

The object of the present invention is to solve the problems mentioned above and to provide a method for producing a semiconductor device by controlling the diffusion of the dopants into the SiC layer in a better way than before, so that it becomes possible to produce high quality semiconductor devices, especially high-voltage power devices with a guard ring protecting the peripheral regions of the device.

This object is, according to the invention, obtained by a further step carried out before step a) referred to above, which comprises the application of a highly of at least a portion of the surface layer of the SiC layer so as to control the dopant diffusivity in the SiC layer under the surface layer portion. Thus, the invention is based on utilizing the fact that non-local interactions are important for dopant diffusion in SiC and other semiconductor materials. These interactions originate from the generation of non-equilibrium intrinsic point defects in the vicinity of the crystal surface. Intrinsic point defects have a very high diffusion coefficient and penetrate deeply into the crystal within a short time. These effects give rise to tails of enhanced dopant diffusion at low concentration for diffusion of dopants of the same type as in the vicinity of the surface and retarded dopant diffusion for diffusion of dopants of a different type. A variation of the conditions of point defect generation at the surface, such as changing the doping of near-surface layers, therefore effects the dopant diffusion deeply in the crystal and can be used for controlling the dopant penetration. Accordingly, the present invention makes it possible to enhance or retard diffusion of dopants under the surface layer portion by an appropriate choice of dopants for doping the surface layer portion by utilizing this effect and it provides thereby a tool for using the planar-diffusion technology for the formation of guard rings in SiC power devices.

According to a preferred embodiment of the invention, different surface layer portions are in step b) differently doped so as to obtain different diffusivities of the dopants in different portions of the SiC layer. This makes it possible to control the rate of diffusion of the dopants as well as the diffusion depths.

According to a second preferred embodiment of the invention, first surface layer portions of the SiC layer are, in step b), highly doped with P-type dopants, whereas second surface layer portions are highly doped with N-type dopants. This means that a certain dopant supplied to the SiC layer surface for diffusion thereinto will be subjected to enhanced diffusion into the first surface layer portions and a retarded diffusion into the second surface layer portions or conversely. Thus, a supply of boron for diffusion will result in that the first surface layer portions will enhance the diffusion of boron therethrough and deeply into the crystal, whereas the second surface layer portions will act as a mask and retard diffusion into the SiC layer there.

According to a third preferred embodiment of the invention, the first surface portions of the SiC layer are highly doped with aluminium, which has been found to radically increase the penetration of the low-concentration tail, whereas according to a fourth preferred embodiment of the invention the second surface layer portions of the SiC layer are highly doped with nitrogen, which dramatically suppresses the tail formation.

According to a fifth preferred embodiment of the invention the surface layer portion of the opposite or same type is applied by ion implantation. It has turned out that especially heavy aluminium doping in a thin surface layer may be achieved by this technique.

According to a sixth preferred embodiment of the invention the dopant supplied for the diffusion is of P-type and accordingly the highly doped surface layer portion of N-type, and the surface layer portion of the opposite type is created by epitaxially growing a thin SiC layer highly doped with N on top of the rest of the SiC layer at a doping concentration above $5 \times 10^{19}$ cm$^{-3}$. An efficient mask for acceptor diffusion, mainly boron, is created in this way.

According to a seventh preferred embodiment of the invention relating to a method for producing a semiconductor power device, a surface layer portion in the peripheral regions of the SiC layer is, in step b), highly doped with dopants of the same type for enhanced diffusion at the periphery thereof, and the heat treatment and thereby the diffusion is in step a) carried out under such conditions that the dopants may penetrate through a junction creating the space charge region of the device for creating a guard ring arranged to smooth out the electric field in the peripheral region in a blocking state of the power device so created. Thus, the use of the different doping according to the invention makes it possible to form guard rings for smoothing out the electric field in the peripheral region in a blocking state of a power device having a SiC layer, so that the electric field at the periphery can remain well below the breakdown threshold.

Further advantages and preferred features of the invention will appear from the following description and the claims.

BRIEF DESCRIPTION OF THE DRAWING

With reference to the appended drawing, the specific description of a preferred embodiment of the invention is described as an example.

In the drawing.

DETAILED DESCRIPTION OF A PREFERRED EMBODIMENT OF THE INVENTION

Figure 1:
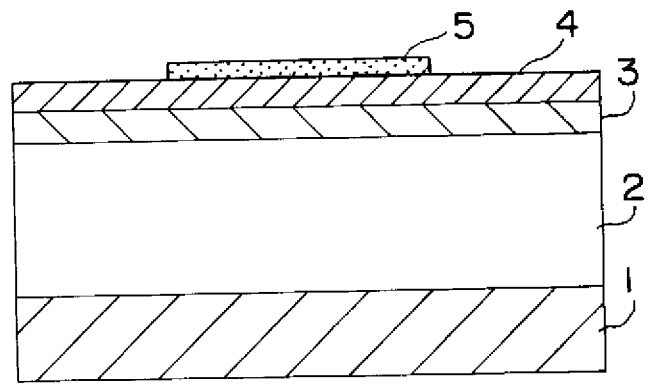
FIGS. 1–5 illustrate schematically different steps of a method for producing a semiconductor power device in the form of a rectifier diode of SiC according to a preferred embodiment of the invention.

FIGS. 1–5 illustrate a few important steps of a large number of steps of the invention for producing a power diode made of SiC by using planar-diffusion technology. All the layers of this device are made of SiC, but hetero-junction devices are also within the scope of the invention. The device will have three differently doped layers, namely a third highly doped layer 1 of N-type for making a low resistance contact with an ohmic contact metal plate of the device (not shown in the drawings), a second low-doped N-type thicker layer 2 arranged thereon and a first thinner P-type layer 3 arranged on top of the second layer 2 and forming a pn-junction at the interface therewith. In a rectifier diode having these three layers, the space charge region is primarily provided by the second low-doped layer, which will take the main part of the voltage applied on the device in the reverse operating direction thereof, a device may have a breakdown voltage in the kV-range. However, the breakdown voltage will be lower near the peripheral surface of the device than in the bulk thereof due to more defects near the surface and risks of spark formation and the like, so that different passivation techniques are necessary. A serious problem with a peripheral breakdown is due to its localized nature, since it only occurs at the periphery and therefore results in a very high current density and specific power dissipation. This may lead to an irreversible device degradation even in the case of a rather low reverse current. Accordingly, it would be advantageous if the possible breakdown would occur uniformly over the diode area so that the current density will be very low and the flow of a high reverse current will not deteriorate the device parameters. Thus, it is highly preferable to remove the weak spots of the diode, since this not only increases the operation voltage but also make it necessary to provide circuitry for preventing the rectifier from overloading. Accordingly, it is desired that the possible breakdown should occur first in the bulk instead of near the periphery.

The method for producing a semiconductor device to be described deals with this problem. The method comprises the step of epitaxially growing a highly doped thin SiC layer 4 of N-type onto the first layer 3 of P-type. Nitrogen is used as dopant when the layer 4 is grown, and the doping thereof should be as high as possible, above $5 \times 10^{19}$ cm$^{-3}$, preferably above $10^{20}$ cm$^{-3}$. The thickness of the layer 4 will preferably be 1–3 $\mu$m. A metal mask 5 will be arranged centrally on the top of the layer 4.

Figure 2:
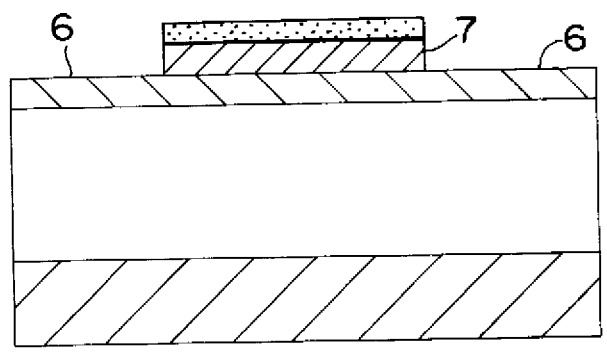

The removal of the highly doped layer 4 of N-type is then carried out by reactive ion etching (RIE) in the peripheral regions 6 as shown in FIG. 2. It is thereby important that a portion of the P-type first layer 3 is retained in these peripheral regions 5. Accordingly, a patterned mask 7 is now obtained.

Figure 3:
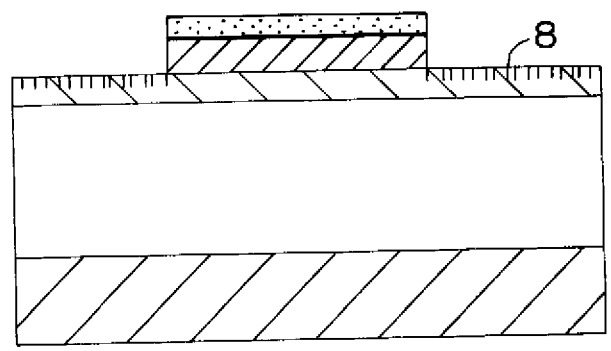
Figure 4:
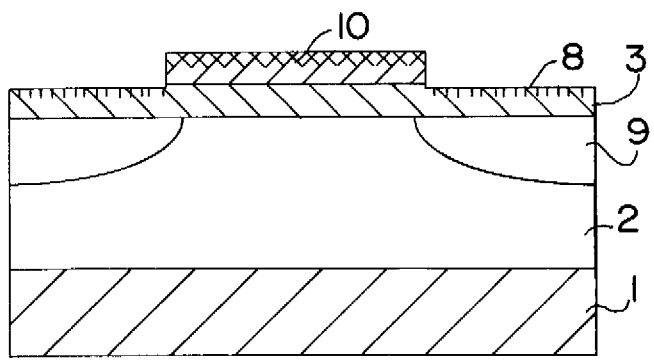

Aluminium ions are now implanted in the peripheral regions by bombardment with an energy of 50–100 KeV and dose of 2–3 $10^{16}$ cm$^{-2}$ so as to form a thin highly doped P-type layer 8 of some tenths of $\mu$m, preferably 0.05–0.2 $\mu$m, in the peripheral region 6 (see FIG. 3). The active region is protected from implantation by the metal mask 5, which is removed after the implantation. The electrically active fraction of the Al-dopants is negligibly small immediately after the implantation because the dopant atoms are either incorporated in complexes with implantations-induced defects or compensated by those defects. Thus, a high temperature annealing is required to obtain activation of a considerable dopant fraction. In the case of P-type dopants in SiC high annealing temperatures comparable to those used for impurity diffusion are required to obtain a high efficiency of dopant activation, so that the entire SiC wafer is annealed at 1700°–1850° C. to re-crystallize the ion-implanted layer.

In the next step, boron is applied to the surface of the SiC layer while heating the SiC layer at 1600°–1750° C. It has been found that boron has a reasonably high diffusivity in SiC at these temperatures, and the thin, highly doped P-type layer 8 will radically enhance the diffusion of boron in the peripheral regions 6 of the SiC layer, whereas the highly doped N-type layer 4 will act as a mask and efficiently retard diffusion of boron thereinto and accordingly into the central active region of the semiconductor layers 2 and 3. Thus, a suitable choice of the diffusion regimes (temperature, diffusion time, supply rate of boron) will provide a sufficiently thick compensated layer 9 in the form of a guard ring in the peripheral region of the wafer and the penetration of boron through the mask 4 will be prevented. It is indicated at 10 in FIG. 4 how boron will only penetrate into a part of the retarding layer 4. The guard ring thus obtained will extend the pn-junction of the device thus created in the peripheral regions thereof so that the electric field in the peripheral region will be smoothed out in a blocking state of such a power device, preventing a possible breakdown from occurring firstly at the periphery of the device.

Figure 5:
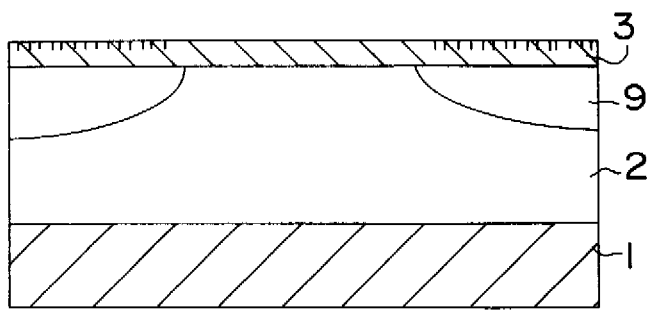

Finally, it is shown in FIG. 5 how the structure has been etched by RIE for removing the highly doped N-type layer 4 from the active region and defining the diode area. The highly doped P-type layer 8 may then eventually be removed from the guard ring region. Then several steps of the usual sequence of device termination follow, such as oxidation or deposition of a dielectric, contact metal deposition and so on. The real method for producing the power rectifier diode will of course involve numerous additional steps, which may be performed in a conventional way, and only the steps of importance for the invention have been described above.

The invention is of course not in any way restricted to the embodiment described above, but several possibilities to modification thereof would be apparent to one skilled in the art without departing from the basic idea of the invention.

It would for instance be possible to use phosphorous as a donor for epitaxially growing a diffusion retarding highly doped layer of N-type; but it is practically difficult to obtain the same high donor concentration with phosphorous as with nitrogen.

The provision of highly doped surface portions of a SiC wafer for controlling diffusion of dopants thereinto may also be used for other purposes than defining guard rings, namely this planar-diffusion technique may also be used for area-defined doping for producing different types of SiC devices.

Furthermore, it would of course be possible to provide highly doped surface layer portions only over a part of the SiC layer surface, for instance in the guard ring case by applying a highly doped diffusion enhancing layer in the peripheral region and using a mask of AlN for preventing diffusion from occurring in the active region of the device.

Accordingly, the method according to the invention may be used for the production of any type of semiconductor device having a SiC layer. The definition "SiC layer" will also include that this SiC layer may consist of several sub-layers as shown in the Figures. Furthermore, the definition layer is to be interpreted broadly and comprise all types of volume extensions and shapes.

All definitions concerning the material of the different layers of course also include inevitable impurities as well as intentional doping when SiC is concerned.

Boron has been found to be most suitable as a dopant for defining the guard rings, but diffusion of other dopants may be envisaged, such as for instance beryllium, which has a reasonably high diffusivity in SiC but is highly toxic.

The diffusion enhancing layer may also be created by other methods than ion implantation, but this technique is probably believed to be the best one.

We claim:

1. A method for producing a semiconductor device having a semiconductor layer of a SiC, said method comprising the steps of
    a) supplying dopants to the surface of the SiC layer during heating thereof for diffusion of said dopants into the SiC layer, and
    b) prior to step a) highly doping at least a portion of the surface layer in the peripheral regions of the SiC layer with dopants of the same conductivity type as that of the dopants for said diffusion for obtaining enhanced diffusion of dopants at the periphery of the SiC layer under said surface layer portion, and
    wherein the heat treatment and thereby the diffusion in step a) is carried out under such conditions that the dopants may penetrate through a junction thereby creating the space charge region of said device for creating a guard ring arranged to smooth out the electric field in the peripheral region during a blocking state of the power device.

2. A method for producing a semiconductor device having a semiconductor layer of a SiC, said method comprising the steps of
    a) supplying dopants to the surface of the SiC layer during heating thereof for diffusion of said dopants into the SiC layer, and
    b) highly doping at least a portion of the surface layer of the SiC layer prior to step a) with dopants of an opposite conductivity type to that of the dopants supplied for said diffusion, to control diffusion of dopants into the SiC layer under said surface layer portion, whereby said surface layer portion in step a) functions as a diffusion mask and wherein said mask is first created by epitaxial growth of a highly doped layer followed by a patterning thereof for removing said mask layer in the peripheral regions of the SiC layer, an ion implantation is then carried out for creating a thin highly doped surface layer in said peripheral regions, then the SiC layer is annealed so as to re-crystallize the ion-implanted layer, said diffusion step is carried out for forming a guard ring, and then the mask layer is removed in a non-mechanical way.

3. A method according to claim 1, wherein in step b) first surface layer portions of the SiC layer are highly doped with P-type dopants, whereas second surface layer portions of the SiC layer are highly doped with N-type dopants.

4. A method according to claim 1, wherein in step b) a very thin highly doped layer of the same conductivity type is applied, said layer having a thickness below 0.5 $\mu$m.

5. A method according to claim 2, wherein said surface layer portion of the opposite or same conductivity type is applied by ion implantation.

6. A method according to claim 5, wherein said ion implantation is carried out with an energy of 50–100 KeV and at a dose of 2–3×10$^{16}$ per cm$^2$.

7. A method according to claim 2, wherein said highly doped surface layer portion is obtained by doping with aluminum.

8. A method according to claim 5, wherein the SiC layer is annealed through heating after the ion implantation for re-crystallizing the ion implanted surface layer portion.

9. A method according to claim 4, wherein the dopants supplied for said diffusion are of P-type and said highly doped surface layer portion is of N-type.

10. A method according to claim 9, wherein said surface layer portion of said opposite conductivity type is created by epitaxially growing a thin SiC layer highly doped with N-type dopants on top of the SiC layer at a doping concentration above 5×10$^{19}$ cm$^3$.

11. A method according to claim 1 or 2, wherein the SiC layer is heated above 1500° C. during said diffusion step.

12. A method according to claim 1 or 2, wherein the dopant supplied for the diffusion is boron.

13. A method according to claim 1, wherein said SiC layer is made of at least two sub-layers, a first uppermost layer of P-type and a second layer of N-type supporting the first layer.

14. A method according to claim 2 wherein in step b) different surface layer portions are doped with dopants having opposite conductivity so as to obtain different diffusivities of the dopants in different portions of the SiC layer.

15. A method according to claim 2 wherein the SiC layer is heated above 1500° C. during said diffusion step.

16. A method according to claim 1 wherein the dopant supplied for the diffusion is boron.

* * * * *